US008166432B2

(12) United States Patent
Kosugi

(10) Patent No.: US 8,166,432 B2
(45) Date of Patent: Apr. 24, 2012

(54) TIMING VERIFICATION METHOD AND TIMING VERIFICATION APPARATUS

(75) Inventor: Kazuyuki Kosugi, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 694 days.

(21) Appl. No.: 11/907,395

(22) Filed: Oct. 11, 2007

(65) Prior Publication Data

US 2008/0104563 A1 May 1, 2008

(30) Foreign Application Priority Data

Oct. 30, 2006 (JP) ................................ 2006-293920

(51) Int. Cl.
*G06F 17/50* (2006.01)
*G06F 9/455* (2006.01)

(52) U.S. Cl. ........ 716/108; 716/104; 716/106; 716/109; 716/111; 716/113; 716/132; 716/133; 716/134; 703/14; 703/19

(58) Field of Classification Search .................. 716/2, 4, 716/5, 6, 10, 11, 14; 703/14, 19
See application file for complete search history.

(56) References Cited

U.S. PATENT DOCUMENTS

| | | | | |
|---|---|---|---|---|
| 5,471,409 A | * | 11/1995 | Tani ................................ | 703/14 |
| 6,604,066 B1 | * | 8/2003 | Hatsuda .......................... | 703/19 |
| 6,938,233 B2 | * | 8/2005 | Satoh et al. .................... | 716/113 |
| 6,971,074 B2 | * | 11/2005 | Hasegawa et al. ................ | 716/2 |
| 6,988,254 B2 | * | 1/2006 | Iwanishi et al. .................. | 716/6 |
| 7,039,572 B1 | * | 5/2006 | Narahara et al. ................ | 703/14 |
| 7,171,641 B2 | * | 1/2007 | Kurose et al. ..................... | 716/6 |
| 7,225,418 B2 | * | 5/2007 | Shimazaki et al. ........... | 716/113 |
| 7,272,810 B2 | * | 9/2007 | Orita .............................. | 716/10 |
| 7,295,938 B2 | * | 11/2007 | Nakashiba et al. ............. | 702/69 |
| 7,401,308 B2 | * | 7/2008 | Ushiyama et al. ............. | 716/113 |
| 7,536,658 B2 | * | 5/2009 | Kwon et al. ................... | 716/104 |
| 7,900,166 B2 | * | 3/2011 | Kariat et al. .................... | 703/14 |
| 2006/0091550 A1 | * | 5/2006 | Shimazaki et al. ........... | 257/758 |

FOREIGN PATENT DOCUMENTS

| | | |
|---|---|---|
| JP | 2003-256497 | 9/2003 |
| JP | 2004-118802 | 4/2004 |

OTHER PUBLICATIONS

Bai et al.; "RC power bus maximum voltage drop in digital VLSI circuits"; Mar. 26-28, 2001; Quality Electronic Design, 2001 International Symposium on; pp. 257-258.*

* cited by examiner

*Primary Examiner* — Helen Rossoshek
(74) *Attorney, Agent, or Firm* — Staas & Halsey LLP

(57) ABSTRACT

Timing verification method includes processes wherein timing analysis is performed taking voltage drop of a laid out circuit into consideration and a changing instruction list for changing the laid out circuit is produced based on a result of the timing analysis. Then, in a first-time timing verification process, voltage drop analysis is performed for the laid out circuit so that a voltage drop list is produced based on a result of the voltage drop analysis and timing analysis is performed using the voltage drop list, and, in a later timing verification process, the voltage drop list is updated based on the changing instruction list and the timing analysis is performed using the updated voltage drop list.

16 Claims, 9 Drawing Sheets

FIG. 3(A)

```
      EXAMPLE OF IR-DROP
  VALUE LIST FOR EACH INSTANCE

INSTANCE       VOLTAGE      CELL
    NAME          VALUE       NAME

TOP/INST_A       1.09        A1
  TOP/INST_B       1.08        B1
  TOP/INST_C       1.07        C1
  ChipA/decoder1/U20  1.07     INV1
  ChipA/decoder1/U21  1.09     BUF1
   .
   .
  top/fcdec1/U50   1.07        D1
  ChipA/vecter1/U1 1.08        2ANDM
  BUFCAP           1.09        E1
  ChipTop/data     1.07        F1
   .
   .
```

FIG. 3(B)

```
     EXAMPLE OF IR-DROP VALUE LIST
  FOR EACH INSTANCE AFTER UPDATING

INSTANCE       VOLTAGE      CELL
    NAME          VALUE       NAME

TOP/INST_A       1.09        A1
  TOP/INST_B       1.08        B1
  TOP/INST_C       1.07        C1
  ChipA/decoder1/U20  1.07     INV1
  ChipA/decoder1/U21  1.09     BUF1
   .
   .
  ChipA/vecter1/U1 1.08        2ANDL
  BUFCAP           1.09        E1
  ChipTop/data     1.07        F1
  INSERT1          1.09        BUFH
  INSERT2          1.09        BUFH
  INSERT3          1.07        BUFH
  INSERT4          1.07        BUFH
   .
   .
```

FIG. 4

```
EXAMPLE OF CONFIGURATION OF ECO LIST

O: ChipA/vecter1/U1;
V:RP;
C:2ANDL;

O:INSERT1(BUFH.A,Y),INSERT2(BUFH.A,Y);
V:IN;
C:BUFCAP.X;

O:INSERT3(BUFH.A,Y),INSERT4(BUFH.A,Y);
V:IN;
C:ChipTop/data.A;

O:top/fcdec1/U50;
V:DL;
```

FIG. 5(A)

| EXAMPLE OF CONFIGURATION OF ARRANGEMENT WIRING DB | | | | | |
|---|---|---|---|---|---|
| INSTANCE NAME | CELL NAME | ATTRIBUTE | COORDINATE X | COORDINATE Y | DIRECTION (N, S, W, E) |
| ChipA/decoder1/U20 | INV1 | + PLACED | (100050 | 499950) | N ; |
| ChipA/decoder1/U21 | BUF1 | + PLACED | (300050 | 700050) | S ; |
| . | | | | | |
| . | | | | | |
| ChipA/vecter1/U1 | 2ANDM | + PLACED | (200000 | 800000) | N ; |
| BUFCAP | E1 | + PLACED | (300000 | 700000) | S ; |
| ChipTop/data | F1 | + PLACED | (100000 | 500000) | N ; |
| Top/fcdec1/U50 | D1 | + PLACED | (400000 | 600000) | N ; |
| . | | | | | |
| . | | | | | |

FIG. 5(B)

| EXAMPLE OF CONFIGURATION OF ARRANGEMENT WIRING DB AFTER UPDATING | | | | | |
|---|---|---|---|---|---|
| INSTANCE NAME | CELL NAME | ATTRIBUTE | COORDINATE X | COORDINATE Y | DIRECTION (N, S, W, E) |
| ChipA/decoder1/U20 | INV1 | + PLACED | (100050 | 499950) | N ; |
| ChipA/decoder1/U21 | BUF1 | + PLACED | (300050 | 700050) | S ; |
| . | | | | | |
| . | | | | | |
| ChipA/vecter1/U1 | 2ANDL | + PLACED | (200000 | 800000) | N ; |
| BUFCAP | E1 | + PLACED | (300000 | 700000) | S ; |
| ChipTop/data | F1 | + PLACED | (100000 | 500000) | N ; |
| INSERT1 | BUFH | + PLACED | (300000 | 700100) | S ; |
| INSERT2 | BUFH | + PLACED | (300100 | 700100) | N ; |
| INSERT3 | BUFH | + PLACED | (100000 | 499900) | S ; |
| INSERT4 | BUFH | + PLACED | (100100 | 499900) | N ; |
| . | | | | | |
| . | | | | | |

| VOLTAGE DROP RANGE | BLOCK COORDINATES B (X, Y) | COORDINATES OF LEFT UPPER AND RIGHT LOWER LOCATIONS TO BLOCK (X, Y) |
| --- | --- | --- |
| Range 1 | B(2,1) | (1,0) (2,1) |
| Range 2 | B(2,2) | (1,1) (2,2) |
| Range 3 | B(5,3) | (4,2) (5,3) |
| Range 4 | B(6,5) | (5,4) (6,5) |

FIG. 8

| INSTANCE NAME | VOLTAGE RANGE | BLOCK COORDINATE B(X,Y) | COORDINATES OF LEFT UPPER AND RIGHT LOWER LOCATIONS TO BLOCK (X,Y) |
|---|---|---|---|
| TOP/inst1/A | Range1 | B(2,1) | (1,0) (2,1) |
| HLB/inst10 | Range2 | B(2,2) | (1,1) (2,2) |
| inst3 | Range3 | B(5,3) | (4,2) (5,3) |
| ADD/inst5 | Range4 | B(6,5) | (5,4) (6,5) |
| . . . | | | |
| BUFCAP | Range1 | B(3,7) | (2,6) (3,7) |
| ChipTop/data | Range2 | B(1,4) | (0,3) (1,4) |
| . . . | | | |

TIMING VERIFICATION METHOD AND TIMING VERIFICATION APPARATUS

CROSS REFERENCE TO RELATED APPLICATION(S)

This application is based on and hereby claims priority to Japanese Application No. 2006-293920 filed on Oct. 30, 2006 in Japan, the contents of which are hereby incorporated by reference.

BACKGROUND

1) Field

This embodiment relates to a timing verification method, a timing verification apparatus, a timing verification program suitable for use with layout design of a semiconductor integrated circuit wherein power supply voltage drop (IR-Drop) analysis is performed.

2) Description of the Related Art

In recent years, in timing verification in layout design of a semiconductor integrated circuit (LSI), power supply voltage drop (IR-Drop) analysis is performed and timing analysis is performed taking a result of the power supply voltage drop analysis into consideration to perform circuit changing [generally called ECO (Engineering Change Orders)] for timing adjustment.

Here, FIG. 9 is a flow chart illustrating a general design process including such processes (timing ECO processes) as IR-Drop analysis, timing analysis and ECO.

First, a net list is produced by logic synthesis (step A10).

Then, a layout process, that is, arrangement of cells and wiring, are performed based on the net list (step A20). It is to be noted that arrangement wiring data of the laid out circuit are stored into an arrangement wiring database (DB).

Thereafter, resistance values and capacitance values (RC) of the laid out circuit are extracted (RC Extraction; step A30). It is to be noted that the extracted resistance values and capacitance values are stored as a SPEF (Standard Parasitic Exchange Format) file into a storage unit.

Then, IR-Drop analysis is performed for the entire laid out circuit using the arrangement wiring data stored in the arrangement wiring database, the extracted resistance values and capacitance values and so forth (step A40). It is to be noted that a result of the analysis is stored into an IR-Drop analysis database.

Then, estimate calculation of delay values is performed based on the extracted resistance values and capacitance values (delay calculation) (step A50). Thereafter, timing analysis, for example, by a static timing analyzer (STA) is performed using the delay values estimated by the delay calculation and the result of the IR-Drop analysis (step A50).

If a timing error is found as a result of the timing analysis, then timing adjustment for correcting a portion at which the timing error appears is performed, and an ECO list for indicating circuit changing [for example, addition of a cell (for example, insertion of a buffer), deletion of a cell, resizing of a cell (gate sizing; for example, changing of the power type)] is produced (step A60).

Thereafter, the processes at steps A20 to A60 (timing ECO processes) are repetitively performed until the timing error is eliminated (that is, the ECO list disappears).

It is to be noted that, for example, Japanese Patent Laid-Open No. 2004-118802 discloses that, in layout design of a semiconductor integrated circuit, power supply voltage drop (IR-Drop) analysis is performed after a layout process is performed, and timing analysis is performed taking a result of the IR-Drop analysis into consideration. Further, Japanese Patent Laid-Open No. 2003-256497 discloses that the voltage drop amount for each of instances (cells) is calculated when timing analysis is performed.

SUMMARY

The embodiment provides that a timing verification method including that performing timing analysis taking a voltage drop of a laid out circuit into consideration, and producing a changing instruction list for changing the laid out circuit based on a result of the timing analysis, wherein in a first-time timing verification process, voltage drop analysis is performed for the laid out circuit and a voltage drop list is produced based on a result of the voltage drop analysis, and then the timing analysis is performed using the voltage drop list, and in a later timing verification process, the voltage drop list is updated based on the changing instruction list and the timing analysis is performed using the updated voltage drop list.

BRIEF DESCRIPTION OF THE DRAWINGS

FIG. 3(A) is a view illustrating an example of a configuration of an IR-Drop value list for each of instances produced by the timing verification apparatus according to the first and second embodiments, and FIG. 3(B) is a view illustrating an example of a configuration of the IR-Drop value list for each instance after updating;

FIG. 4 is a view illustrating an example of a configuration of an ECO list produced by the timing verification apparatus according to the first and second embodiments;

FIG. 5(A) is a view illustrating an example of a configuration of an arrangement wiring database produced by the timing verification apparatus according to the first and second embodiments, and FIG. 5(B) is a view illustrating an example of a configuration of the arrangement wiring database after updating;

FIG. 8 is a view illustrating data included in the IR-Drop map produced by the timing verification apparatus according to the fourth embodiment.

DESCRIPTION OF THE EMBODIMENTS

In the following, timing verification methods, timing verification apparatus, timing verification programs and computer-readable recording media on which the timing verification programs are stored according to embodiments are described with reference to the drawings.

First Embodiment

First, a timing verification method, a timing verification apparatus and a timing verification program according to a first embodiment are described with reference to FIGS. 1, 2, 3(A), 3(B), 4, 5(A) and 5(B).

The timing verification apparatus (timing verification method) according to the embodiment performs, as timing verification in layout design of a semiconductor integrated circuit (LSI), timing analysis taking power supply voltage drop (IR-Drop) of a laid out circuit into consideration and performs circuit changing [layout changing; generally called ECO (Engineering Change Orders)] for timing adjustment.

Further, as hereinafter described, the timing verification apparatus produces an IR-Drop value list for each instance based on a result of power supply voltage drop (IR-Drop) analysis for each of instances (cells) in order to perform timing analysis.

Particularly, although the IR-Drop analysis is performed in a first-time timing verification process (timing ECO process), it is not performed in later timing verification processes. Then, in the later timing verification processes, an IR-Drop value list for each of instances produced based on a result of the IR-Drop analysis in the first-time timing verification process is updated based on an ECO list (changing instruction list), and the timing analysis is performed using the updated IR-Drop value list for each instance.

The timing verification apparatus according to the embodiment is described in more detail below.

Figure 2:
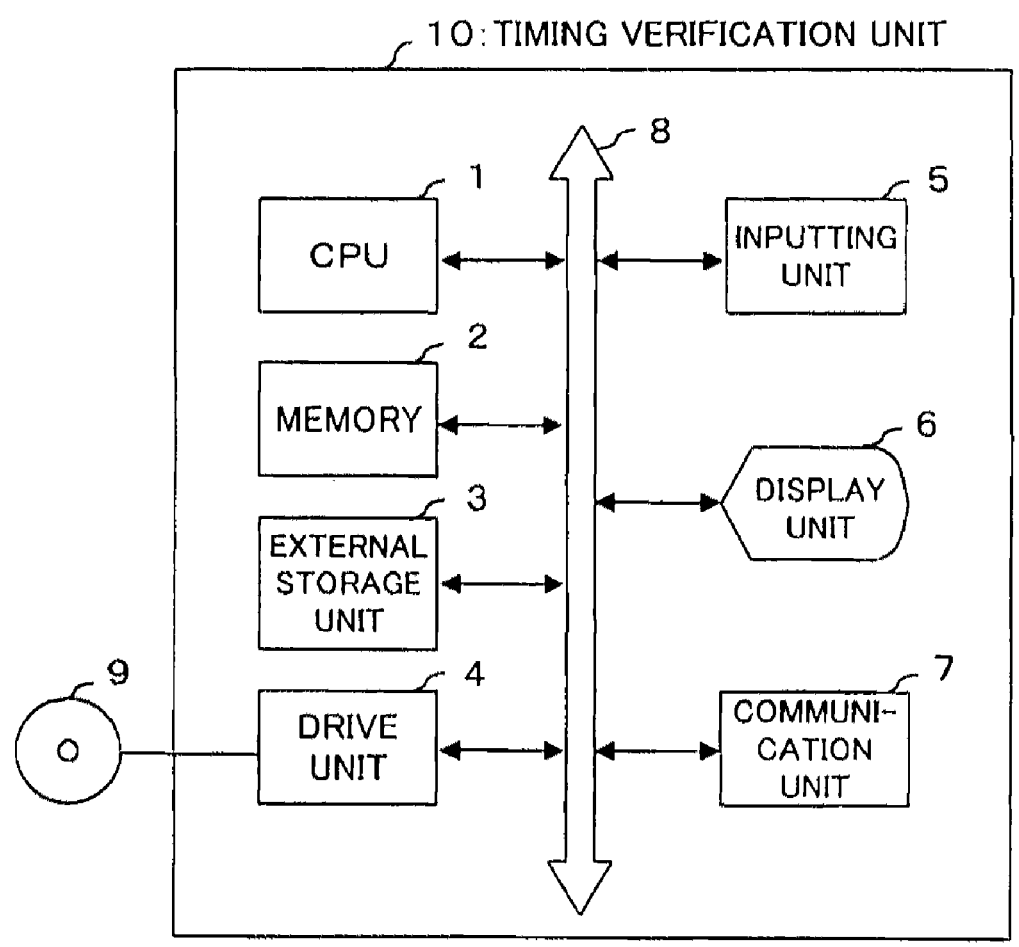
FIG. 2 is a view showing a hardware configuration of the timing verification apparatus according to the first embodiment.

First, a hardware configuration of the timing verification apparatus is described with reference to FIG. 2.

The timing verification apparatus can be implemented using a computer. The timing verification apparatus includes, as the hardware configuration thereof, for example, as shown in FIG. 2, a CPU 1, a memory 2, an external storage unit 3, a drive unit 4, an inputting unit 5, a display unit 6 and a communication unit 7, which are connected to each other by a bus 8. It is to be noted that, in FIG. 2, reference numeral 9 denotes a portable type recording medium. Further, the hardware configuration of the timing verification apparatus is not limited to the specific one shown in FIG. 2.

Here, the CPU 1 (controller) controls the entire computer, and reads out a program into the memory 2 and executes the program to perform a process necessary for timing verification.

The memory 2 is, for example, a RAM, and temporarily stores a program or data when the program is executed and rewriting of data or the like is performed.

The external storage unit 3 is, for example, a hard disk drive and stores a program (timing verification program) for a timing verification process hereinafter described and various data. It is to be noted that the external storage unit 3 functions also as a database.

The drive unit 4 accesses storage contents of the portable type recording medium such as, for example, an optical disk, a magneto-optical disk or the like.

The inputting unit 5 is, for example, a keyboard, a mouse or the like and is used to input an instruction from the operator and a parameter.

The display unit 6 is, for example, a CRT, an LCD, a PDP or the like and is used to display a layout, a parameter inputting screen and so forth.

The communication unit 7 is used to communicate with a different apparatus through a communication network such as, for example, a LAN, the Internet or the like.

In the computer having such a hardware configuration as described above, the timing verification apparatus 10 is implemented by the CPU 1 reading out the timing verification program stored, for example, in the external storage unit 3 into the memory 2 and executing the program.

Figure 1:
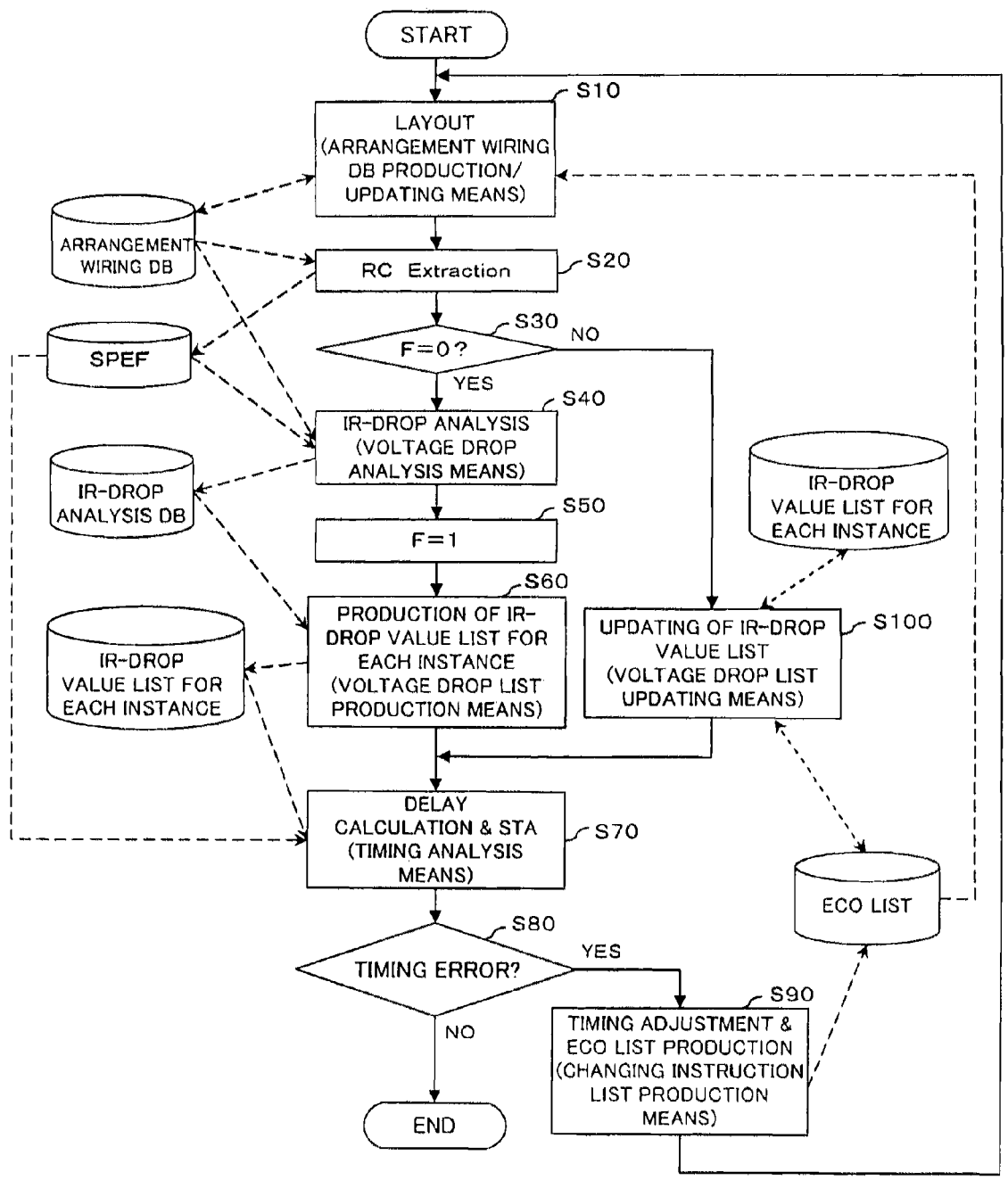
FIG. 1 is a flow chart illustrating a timing verification process (timing verification method) by timing verification apparatus according to first and second embodiments.

Now, a timing verification process (timing ECO process; timing verification method) executed by the CPU 1 in accordance with the timing verification program read out into the memory 2 in the timing verification apparatus 10 is described with reference to a flow chart of FIG. 1.

First, the CPU 1 performs a layout process, that is, an arrangement wiring process for cells, based on a net list produced by logic synthesis (step S10). Then, arrangement wiring data of the laid out circuit are stored into the external storage unit 3. In this manner, the CPU 1 produces an arrangement wiring database (DB) based on a result of the layout process.

Therefore, the timing verification apparatus 10 has a function (arrangement wiring database production means) for producing an arrangement wiring database based on a result of the layout process.

Here, for example, as shown in FIG. 5(A), arrangement wiring data (list of arrangement wiring data) stored in the arrangement wiring database have a configuration that instance names and position information are associated with each other, and an instance name, an attribute, a coordinate X, a coordinate Y, and a direction (N, S, W, E) are described in order.

Here, the contents of the arrangement wiring database are described as given below.

In particular, for example, as shown in FIG. 5(A), the attribute of the instance (cell name INV1) of the instance name ChipA/decoder1/U20 is [PLACED] and the instance is arranged at coordinates (100050, 499950), and the direction of the instance is the N direction. Meanwhile, the attribute of the instance (cell name BUF1) of the instance name ChipA/decoder1/U21 is [PLACED] and the instance is arranged at coordinates (300050, 700050), and the direction of the instance is the S direction. Further, the attribute of the instance (here, M type 2AND; cell name 2ANDM) of the instance name ChipA/vecter1/U1 is [PLACED] and the instance is arranged at coordinates (200000, 800000), and the direction of the instance is the N direction. Further, the attribute of the instance (cell name E1) of the instance name BUFCAP is [PLACED] and the instance is arranged at coordinates (300000, 700000), and the direction of the instance is the S direction. Further, the attribute of the instance (cell name F1) of the instance name ChipTop/data is [PLACED] and the instance is arranged at coordinates (100000, 500000), and the direction of the instance is the N direction. Furthermore, the attribute of the instance (cell name D1) of the instance name Top/fcdec1/U50 is [PLACED] and the instance is arranged at coordinates (400000, 600000), and the direction of the instance is the N direction.

Thereafter, the CPU 1 performs a process for extracting (calculating) a resistance value and a capacity value (RC) of the laid out circuit based on the arrangement wiring data stored in the arrangement wiring database (RC Extraction; step S20). Then, the extracted resistance value and capacity value are stored, for example, as an SPEF (Standard Parasitic Exchange Format) file into the external storage unit 3.

Further, the CPU 1 decides whether or not the value of a flag F is "0" (F=0?) (step S30).

It is to be noted that the flag F is used to decide whether or not IR-Drop analysis hereinafter described is performed. Then, where the value of the flag F is "0", it is indicated that the IR-Drop analysis is not performed, but, where the value of the flag F is "1", it is decided that the IR-Drop analysis is performed. An initial setting value of the flag F is "0".

Since it is recognized from a result of the decision that the process at the present time is a first-time timing verification process and the value of the flag F is "0" which is the initial setting value (F=0), the processing advances to a "YES" route.

Then, the CPU 1 performs IR-Drop analysis for the laid out circuit using the arrangement wiring data stored in the arrangement wiring database, the resistance value and capacity value stored as the SPEF file in the external storage unit 3 and so forth (step S40). Then, a result of the IR-Drop analysis is stored into the external storage unit 3. In this manner, the CPU 1 produces an IR-Drop analysis database (DB).

Therefore, the timing verification apparatus 10 includes a function (voltage drop analysis means) for performing IR-Drop analysis (voltage drop analysis) for a laid out circuit.

Then, since the IR-Drop analysis is performed at step S40, the CPU 1 sets the value of the flag F to "1" (F=1) (step S50).

Thereafter, the CPU 1 produces an IR-Drop value list (voltage drop list) for each instance based on the result of the IR-Drop analysis stored in the IR-Drop analysis database (step S60). Then, the produced IR-Drop value list for each instance is stored into the external storage unit 3.

Therefore, the timing verification apparatus 10 includes a function (voltage drop list production means) for producing an IR-Drop value list (voltage drop list) for each instance based on a result of IR-Drop analysis (voltage drop analysis).

Here, the IR-Drop value list for each instance has a configuration wherein instance names and voltage values after IR-Drop (voltage drop) are associated with each other, for example, as shown in FIG. 3(A), and the instance name, voltage value (IR-Drop values) after IR-Drop and cell name are described in order. It is to be noted that a reference voltage value (voltage value before voltage drop) is 1.1.

Here, the contents of the IR-Drop value list are described as given below.

In particular, as shown in FIG. 3(A), the voltage value after IR-Drop of the instance (cell name A1) of the instance name TOP/INST_A is 1.09. Further, the voltage value after IR-Drop of the instance (cell name B1) of the instance name TOP/INST_B is 1.08. Further, the voltage value after IR-Drop of the instance (cell name C1) of the instance name TOP/INST_C is 1.09. Further, the voltage value after IR-Drop of the instance (cell name INV1) of the instance name ChipA/decoder1/U20 is 1.07. Further, the voltage value after IR-Drop of the instance (cell name BUF1) of the instance name ChipA/decoder1/U21 is 1.09. Further, the voltage value after IR-Drop of the instance (cell name D1) of the instance name top/fcdec1/U50 is 1.07. Further, the voltage value after IR-Drop of the instance (cell name 2ANDM) of the instance name ChipA/vecter1/U1 is 1.08. Further, the voltage value after IR-Drop of the instance (cell name E1) of the instance name BUFCAP is 1.09. Furthermore, the voltage value after IR-Drop of the instance (cell name F1) of the instance name ChipTop/data is 1.07.

Thereafter, the CPU 1 performs estimation calculation of a delay value based on the resistance value and capacity value stored as the SPEF file (delay calculation) (step S70). Then, timing analysis, for example, by a static timing analyzer (STA) is performed using the delay value estimated by the delay calculation and the IR-Drop value list for each instance stored in the external storage unit 3 (step S70).

Therefore, the timing verification apparatus 10 includes a function (timing analysis means) for performing timing analysis. The timing analysis means is configured such that, in the first-time timing verification process, the timing analysis is performed using the voltage drop list produced by the voltage drop list production means.

Then, the CPU 1 decides based on a result of the timing analysis whether or not a timing error is found (step S80).

If it is recognized from a result of the decision that a timing error is found, then the processing advances to a "YES" route, and the CPU 1 performs timing adjustment for correcting the timing error and produces an ECO list (changing instruction list) for indicating changing of a laid out circuit such as, for example, addition of a cell (for example, insertion of a buffer), deletion of a cell, resizing of a cell (gate sizing; for example, changing of the power type) and so forth (step S90). Then, the produced ECO list is stored into the external storage unit 3.

Therefore, the timing verification apparatus 10 includes a function (changing instruction list production means) for producing an ECO list (changing instruction list) for changing a laid out circuit based on a result of timing analysis.

Here, for example, as shown in FIG. 4, the ECO list has a configuration wherein instance names and changing instruction information are associated with each other.

In FIG. 4, the first paragraph indicates an example of a case wherein an instruction to change the power type of a cell (here, change from the M type to the L type) is issued.

Here, "O", "V", and "C" described at the top of the rows define "object", "verb" and "complement", respectively.

Here, it is defined that the M type 2AND (cell name 2ANDM) of the instance name ChipA/vecter1/U1 is power resized (RP) into the L type 2AND (cell name 2ANDL).

Further, in FIG. 4, the second paragraph indicates an example of a case wherein an instruction to insert buffers into the FANOUT side is issued.

Here, "O", "V", and "C" described at the top of the rows define "object", "verb" and "complement", respectively.

Here, it is indicated that two buffers (cell name BUFH) (here, they have an input terminal A and an output terminal Y; BUFH. A, Y) of the instance names INSERT1, INSERT2 should be inserted (IN) so as to connect to an output terminal X (BUFCAP. X) of an instance (cell) of the instance name BUFCAP. It is to be noted that the connection to the output terminal X signifies that the cell of the instance name BUFCAP is a driver cell. Accordingly, it is indicated that the two buffers (cell name BUFH) of the instance names INSERT1, INSERT2 should be inserted into the FANOUT of the driver cell.

Further, in FIG. 4, the third paragraph indicates an example of a case wherein an instruction to insert buffers into the FANIN side is issued.

Here, "O", "V", and "C" described at the top of the rows define "object", "verb", and "complement", respectively.

Here, it is indicated that two buffers (cell name BUFH) (here, they have an input terminal A and an output terminal Y; BUFH. A, Y) of the instance names INSERT3, INSERT4 should be inserted (IN) so as to connect to an input terminal A (ChipTop/data. A) of an instance (cell) of the instance name ChipTop/data. It is to be noted that the connection to the input terminal A signifies that the cell of the instance name ChipTop/data is a receiver cell. Accordingly, it is indicated that the two buffers (cell name BUFH) of the instance names INSERT3, INSERT4 are inserted into the FANIN of the receiver cell.

In FIG. 4, the fourth paragraph indicates an example of a case wherein an instruction to delete a cell (instance) is issued.

Here, "O" and "V" described at the top of the rows define "object" and "verb", respectively.

Here, it is indicated that a buffer (cell name BUFH) of the instance name top/fcdec1/U50 should be deleted (DL).

The first-time timing verification process ends in this manner, and the processing returns to the step S10 in order to perform a second-time timing verification process.

At step S10, in order to perform circuit changing, the CPU 1 reads out the arrangement wiring data stored in the arrangement wiring database and performs a layout process, that is, processes (ECO layout processes) such as addition of a cell (for example, insertion of a buffer), deletion of a cell, resizing of a cell (gate sizing; for example, changing of the power type) and so forth, based on the ECO list. Then, arrangement wiring data (ECO arrangement wiring data) of the circuit laid out based on the ECO list are stored into the external storage unit 3. In this manner, the CPU 1 updates the arrangement wiring database (DB) based on a result of the layout process based on the ECO list.

Therefore, the timing verification apparatus 10 includes a function (arrangement wiring database updating means) for updating an arrangement wiring database based on a result of a layout process based on an ECO list (changing instruction list).

Here, for example, as shown in FIG. 5(B), in the arrangement wiring data (list of the arrangement wiring data) stored in the updated arrangement wiring database, the cell name of the instance of the instance name ChipA/vecter1/U1 is changed into 2ANDL. Further, data regarding an instance of the instance name Top/fcdec1/U50 is deleted.

Further, data regarding instances of the instance names INSERT1, INSERT2, INSERT3, INSERT4 are added. In particular, the attribute of the instance (cell name BUFH) of the instance name INSERT1 is "PLACED" and the instance is arranged at coordinates (300000, 700100), and the direction of the instance is the S direction. Further, the attribute of the instance (cell name BUFH) of the instance name INSERT2 is "PLACED" and the instance is arranged at coordinates (300100, 700100), and the direction of the instance is the N direction. Further, the attribute of the instance (cell name BUFH) of the instance name INSERT3 is "PLACED" and the instance is arranged at coordinates (100000, 499900), and the direction of the instance is the S direction. Further, the attribute of the instance (cell name BUFH) of the instance name INSERT4 is "PLACED" and the instance is arranged at coordinates (100100, 499900), and the direction of the instance is the N direction.

It is to be noted that the instances (cell name E1) of the instance name ChipA/decoder1/U20, the instance name ChipA/decoder1/U21 and the instance name BUFCAP and the instance (cell name F1) of the instance name ChipTop/data are same as those in the arrangement wiring database [refer to FIG. 5(A)] before updating.

Then, similarly as in the first-time timing verification process described above, the CPU 1 performs a process for extracting (calculating) a resistance value and a capacity value (RC) of an ECO laid out circuit based on the arrangement wiring data (ECO arrangement wiring data) stored in the arrangement wiring database (step S20). Then, the extracted resistance value and capacity value are stored, for example, as an SPEF file into the external storage unit 3.

Then, the CPU 1 decides whether or not the value of the flag F is "0" (F=0?) (step S30).

Since, as a result of the decision, the value of the flag F is "1" (F=1), the processing advances to a "NO" route.

Then, the CPU 1 reads out the IR-Drop value list and ECO list stored in the external storage unit 3 and rewrites the IR-Drop value list based on the ECO list. Then, the rewritten IR-Drop value list is stored into the external storage unit 3. The CPU 1 updates the IR-Drop value list for each instance in this manner (step S100).

Therefore, the timing verification apparatus 10 includes a function (voltage drop list updating means) for updating an IR-Drop value list (voltage drop list) for each instance based on an ECO list (changing instruction list).

In particular, where a cell is to be added (for example, a buffer is to be inserted) based on the ECO list, the CPU 1 reads out an IR-Drop value of a driver cell or a receiver cell from the IR-Drop value list based on information which indicates addition of a cell (for example, insertion of a buffer) included in the ECO list.

For example, where a description which indicates insertion of additional cells (for example, buffers) into the FANIN side is included in the ECO list (for example, refer to the second paragraph in FIG. 4), the CPU 1 reads out the instance name (here, BUFCAP) of the driver cell from the ECO list and reads out the IR-Drop value (here, 1.09) of the driver cell from the IR-Drop value list (refer to FIG. 3(A)) for each instance using the instance name of the driver cell.

Then, as shown in FIG. 3(B), the read out IR-Drop value (here, 1.09) is added as an IR-Drop value of an additional cell to the IR-Drop value list in an associated relationship with the instance name (here, INSERT1, INSERT2) and the cell name (here, cell name BUFH) of the additional cell.

Further, for example, where a description which indicates insertion of additional cells (for example, buffers) into the FANOUT side is included in the ECO list (for example, refer to the third paragraph in FIG. 4), the CPU 1 reads out the instance name (here, ChipTop/data) of the receiver cell from the ECO list and reads out the IR-Drop value (here, 1.07) of the receiver cell from the IR-Drop value list [refer to FIG. 3(A)] for each instance using the instance name of the receiver cell.

Then, as seen in FIG. 3(B), the read out IR-Drop value (here, 1.07) is added as the IR-Drop value of the additional cell to the IR-Drop value list in an associated relationship with the instance name (here, INSERT3, INSERT4) and cell name (here, cell name BUFH) of the additional cell.

Further, where a cell is to be deleted based on the ECO list, the CPU 1 deletes the IR-Drop value of the cell to be deleted from the IR-Drop value list based on information (for example, refer to the fourth paragraph in FIG. 4) which indicates deletion of cells included in the ECO list.

For example, as shown in FIGS. 3(A) and 3(B), the CPU 1 reads out the instance name (here, top/fcdec1/U50) of a cell to be deleted from the ECO list and deletes the description (here, the instance name top/fcdec1/U50, the voltage value 1.07, and the cell name D1) associated with the instance name from the IR-Drop value list.

Further, where resizing of a cell (for example, changing of the power type) is to be performed based on the ECO list, the CPU 1 reads out the cell name of the cell to be resized from the IR-Drop value list based on information (for example, refer to the first paragraph in FIG. 4) which indicates resizing of cells included in the ECO list and changes the read out cell name.

For example, as seen in FIGS. 3(A) and 3(B), the CPU 1 reads out the instance name (ChipA/vecter1/U1) of the cell to be resized from the ECO list, and reads out the cell name (here, 2ANDM) of the cell to be resized from the IR-Drop value using the instance name and changes the cell name (here, the cell name is changed into 2ANDL).

It is to be noted that, while only the cell name of a cell to be resized is changed but the IR-Drop value is not changed here, also the IR-Drop value may be changed. For example, in such a case that the power type is changed significantly, the worst value may be set as the IR-Drop value.

Then, similarly as in the first-time timing verification process described above, the CPU 1 performs estimation calculation of a delay value based on the resistance value and capacity value stored as the SPEF file (delay calculation) (step S70). Then, timing analysis, for example, by a static timing analyzer (STA) is performed using the delay value estimated by the delay calculation and the IR-Drop value list [refer to FIG. 3(B)] for each instance after updating stored in the external storage unit 3 (step S70).

Therefore, the timing verification apparatus 10 includes a function (timing analysis means) for performing timing analysis. Further, the timing analysis means is configured such that the timing analysis is performed using the voltage drop list updated by the voltage drop list updating means in and after the second-time timing verification process.

Thereafter, similarly as in the first-time timing verification process described above, the CPU 1 decides whether or not a timing error is found based on a result of the timing analysis (step S80).

If it is recognized from a result of the decision that a timing error is found, then the processing advances to a "YES" route, and the CPU 1 performs timing adjustment for correcting the timing error and produces an ECO list which indicates circuit changing (step S90).

Thereafter, the CPU 1 repetitively executes the processes at steps S10, S20, S30, S100, S70, S80 and S90 (timing verification process) until a timing error is eliminated, that is, until it is decided at step S80 that a timing error is not found.

On the other hand, if it is decided at step S80 that a timing error is not found, then the processing advances to a "NO" route, and the CPU 1 ends the timing verification process.

It is to be noted here that, while the results of the processes are stored into the external storage unit 3 and then read out from the external storage unit 3 in later processes, the timing verification process is not limited to this. For example, in a case wherein the memory capacity is secure sufficiently or in a like case, the results of the processes stored in the memory 2 may be read out and used in each process.

In this manner, the CPU 1 performs the IR-Drop analysis in the first-time timing verification process. However, in later (second-time and following) timing verification processes, the IR-Drop value list for each instance produced based on a result of the IR-Drop analysis in the first-time timing verification process is updated based on the ECO list and timing analysis is performed using the updated IR-Drop value list for each instance without performing IR-Drop analysis.

Accordingly, with the timing verification method, timing verification apparatus and timing verification program in the embodiment, there is an advantage that the processing time can be reduced while the accuracy is maintained.

Second Embodiment

Now, a timing verification method, a timing verification apparatus and a timing verification program according to a second embodiment are described with reference to FIGS. 1, 3(A), 3(B), 4, 5(A) and 5(B).

The timing verification apparatus (timing verification method) according to the embodiment is different from the timing verification apparatus of the first embodiment described above in that, in order to update an IR-Drop value list for each instance, arrangement wiring data updated based on an ECO list is used.

In particular, in the updating process (at step S100 in FIG. 1) of the IR-Drop value list for each instance, the CPU 1 in the present timing verification apparatus 10 reads out the IR-Drop value list and ECO list stored in the external storage unit 3 and rewrites the IR-Drop value list for each instance using the updated arrangement wiring database based on the ECO list. Then, the rewritten IR-Drop value list is stored into the external storage unit 3. In this manner, the CPU 1 updates the IR-Drop value list for each instance.

Therefore, the timing verification apparatus 10 is configured such that the voltage drop list updating means updates the IR-Drop value list (voltage drop list) for each instance using the updated arrangement wiring database based on the ECO list (changing instruction list).

In particular, where cells are to be added (for example, buffers are to be inserted) based on the ECO list, the CPU 1 reads out, based on information which indicates addition of cells (for example, insertion of buffers) included in the ECO list, the IR-Drop values of the cells arranged nearest to the additional cell from the IR-Drop value list using position information of the additional cell included in the updated arrangement wiring database.

For example, where a description which indicates addition of cells (for example, insertion of buffers) is included in the ECO list (for example, refer to the second and third paragraphs in FIG. 4), the CPU 1 reads out the instance names (here, INSERT1, INSERT2 and INSERT3, INSERT4) of the additional cells from the ECO list. Next, coordinates X, Y [here, (300000, 700100), (300100, 700100) and (100000, 499900), (100100, 499900)] of the additional cells are read out from the updated arrangement wiring database [refer to FIG. 5(B)] using the instance names of the additional cells. Then, the instance names (here, ChipA/decoder1/U21 and ChipA/decoder1/U20) of cells arranged at coordinates X, Y nearest to the coordinates X, Y described above are specified, and the IR-Drop values (here, 1.09 and 1.07) of the cells specified from the IR-Drop value list [refer to FIG. 3(A)] for each instance are read out using the specified instance names of the cells.

Then, as seen in FIG. 3(B), the IR-Drop values (here, 1.09 and 1.07) of the cells arranged nearest to the additional cells are added as the IR-Drop values of the additional cells to the IR-Drop value list in an associated relationship with the instance names (here, INSERT1, INSERT2 and INSERT3, INSERT4) and the cell name (here, cell name BUFH).

It is to be noted that addition of cells and resizing of cells are performed similarly as in the processes in the first embodiment described above.

It is to be noted that, since the configuration and process other than those described above are similar to those in the first embodiment described above, description of the configuration and process is omitted.

Accordingly, with the timing verification method, timing verification apparatus and timing verification program of the embodiment, similarly as with the first embodiment described above, there is an advantage that the processing time can be reduced while the accuracy is maintained.

Particularly, since, in the embodiment, the IR-Drop value list for each instance is updated using the arrangement wiring data updated based on the ECO list, for example, also in a case wherein cells are not added to the positions indicated by the instruction included in the ECO list, there is an advantage that the IR-Drop values of additional cells can be decided with a higher degree of certainty using actual position information of the additional cells.

Third Embodiment

Now, a timing verification method, a timing verification apparatus and a timing verification program according to a third embodiment are described with reference to FIGS. 6, 7(A) and 7(B).

The timing verification apparatus (timing verification method) according to the embodiment is different from the timing verification apparatus of the second embodiment described above in that, in order to update the IR-Drop value list for each instance, an IR-Drop map (voltage drop map) produced based on a result of IR-Drop analysis (voltage drop analysis) is used.

In particular, in the updating process (step S100 in FIG. 6) of the IR-Drop value list for each instance, the CPU 1 in the present timing verification apparatus 10 reads out the IR-Drop value list and ECO list stored in the external storage unit 3 and rewrites the IR-Drop value list for each instance using an IR-Drop map produced based on the updated arrangement wiring database and a result of the IR-Drop analysis based on the ECO list. Then, the rewritten IR-Drop value list is stored into the external storage unit 3. In this manner, the CPU 1 updates the IR-Drop value list for each instance.

Therefore, the timing verification apparatus 10 is configured such that the voltage drop list updating means updates the IR-Drop value list (voltage drop list) for each instance using the updated arrangement wiring database and the voltage drop map based on the ECO list (changing instruction list).

Figures 7A, 7B:
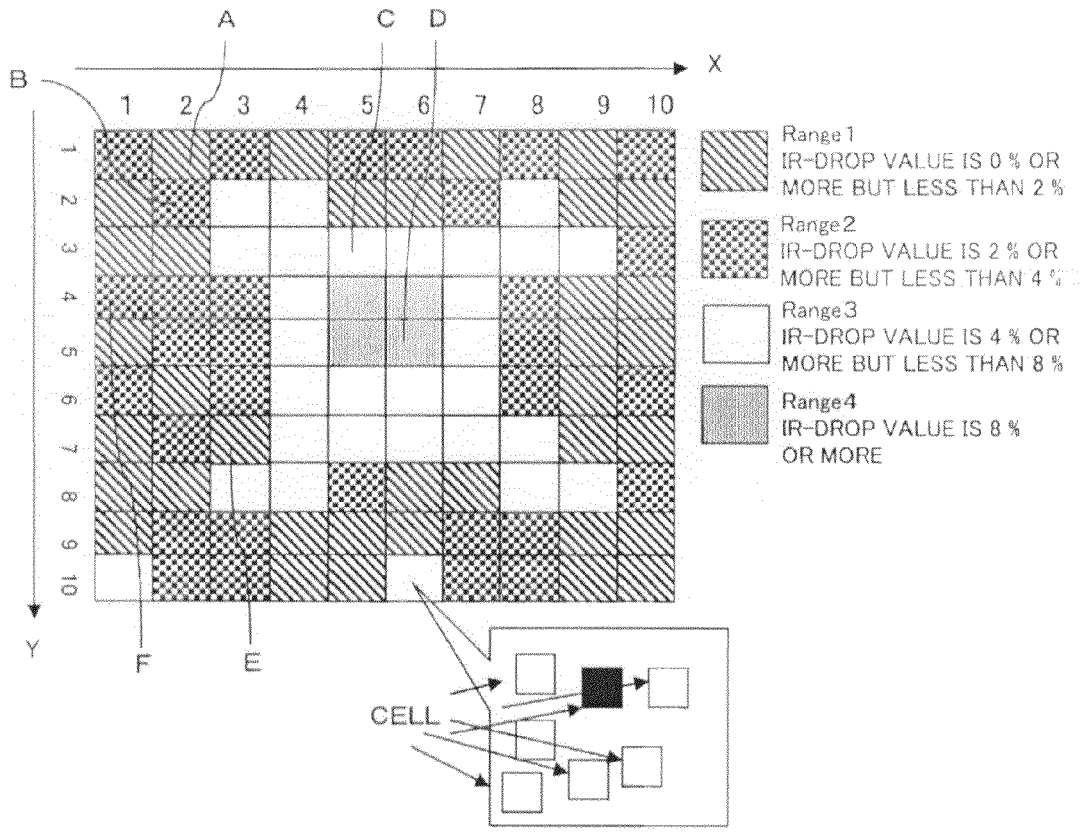
FIG. 7(A) is a view illustrating an example of a configuration of an IR-Drop map produced by the timing verification apparatus according to the third and fourth embodiments.
FIG. 7(B) is a view illustrating data included in the IR-Drop map produced by the timing verification apparatus according to the third embodiment.
Figure 9:
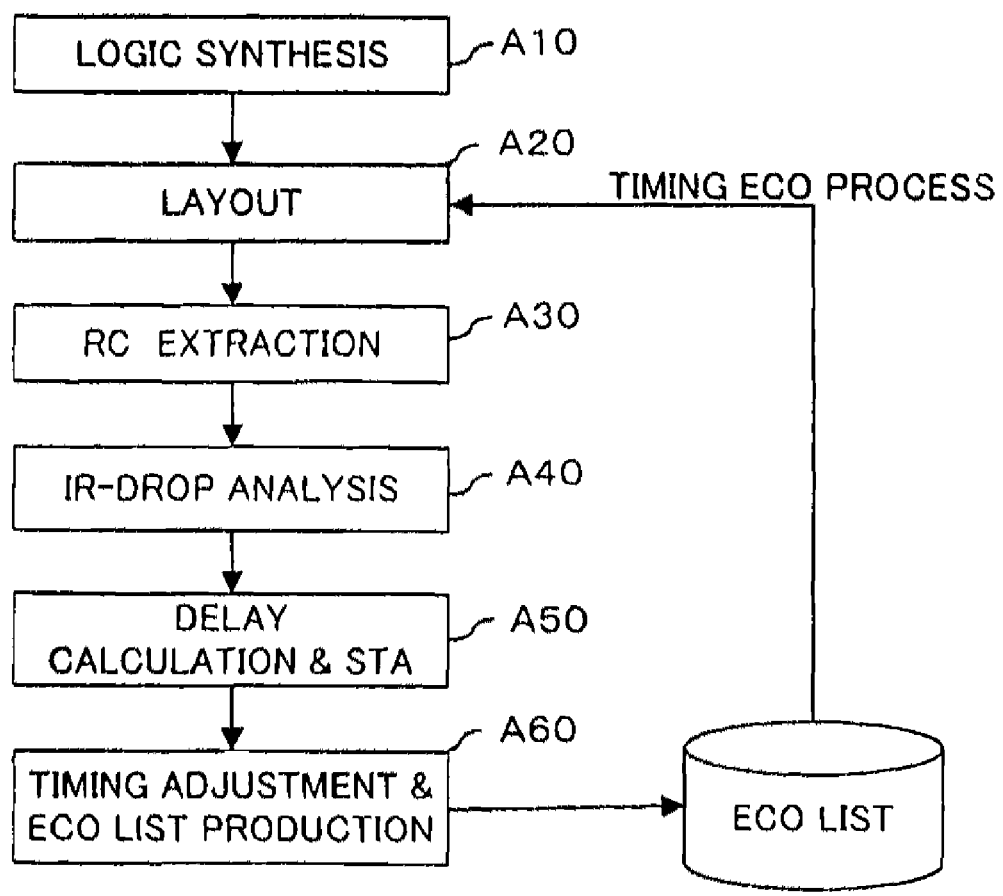
FIG. 9 is a flow chart illustrating a conventional design process including timing verification.

Here, as shown in FIG. 7(A), the IR-Drop map is configured as a map wherein position information of blocks obtained by dividing a chip so as to individually include a plurality of cells and a voltage drop range (range; voltage drop information) are associated with each other.

Here, the voltage drop range is divided into four ranges in accordance with the voltage drop ratio of the voltage value (IR-Drop value) after IR-Drop with respect to a reference voltage value. In particular, the range wherein the voltage drop ratio of the IR-Drop value is 0% or more but less than 2% is defined as a range 1 (Range1), and the range wherein the voltage drop ratio of the IR-Drop value is 2% or more but less than 4% is defined as a range 2 (Range2). Further, the range wherein the voltage drop ratio of the IR-Drop value is 4% or more but less than 8% is defined as a range 3 (Range3), and the range wherein the voltage drop ratio of the IR-Drop value is 8% or more is defined as a range 4 (Range 4).

The IR-Drop map includes, for example, such data as seen in FIG. 7(B), that is, data wherein the voltage drop ranges (individual ranges; voltage drop information) of the IR-Drop value, block coordinates (position information of blocks), and left upper and right lower coordinates of blocks (position information of blocks) are associated with each other.

Here, the block indicated by the reference character A in FIG. 7(B) includes such data that the voltage drop range of the IR-Drop value is Range1, the block coordinates are B (2,1) and the left upper and right lower coordinates of the block are (1,0), (2,1). Further, the block indicated by the reference character B in FIG. 7(B) includes such data that the voltage drop range of the IR-Drop value is Range2, the block coordinates are B (2,2) and the left upper and right lower coordinates of the block are (1,1), (2,2). Furthermore, the block indicated by the reference character C in FIG. 7(B) includes such data that the voltage drop range of the IR-Drop value is Range3, the block coordinates are B (5,3) and the left upper and right lower coordinates of the block are (4,2), (5,3). Still further, the block indicated by the reference character D in FIG. 7(B) includes such data that the voltage drop range of the IR-Drop value is Range4, the block coordinates are B(6,5) and the left upper and right lower coordinates of the block are (5,4), (6,5).

Figure 6:
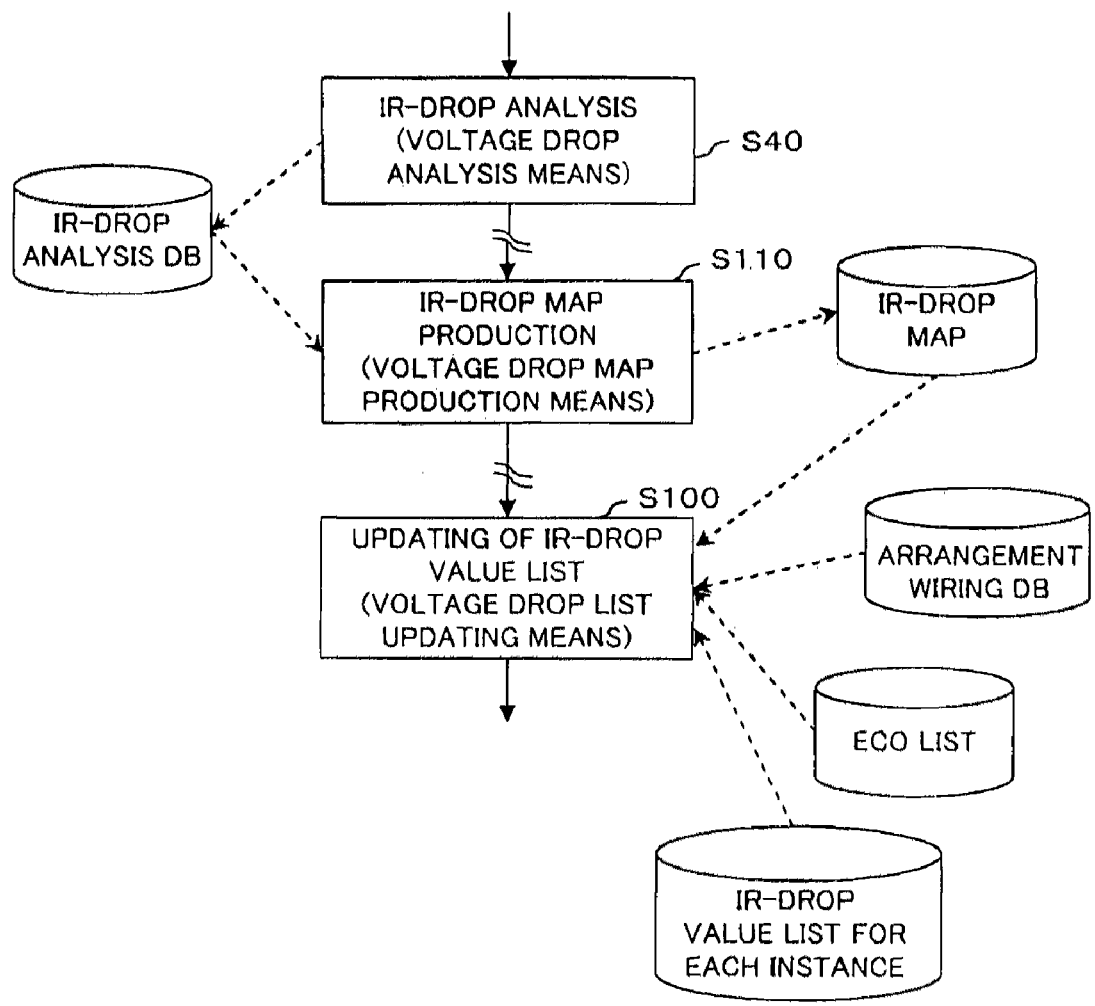
FIG. 6 is a flow chart illustrating a timing verification process (timing verification method) by a timing verification apparatus according to a third embodiment.

As shown in FIG. 6, the IR-Drop map having such a configuration as described above is produced by the CPU 1 based on a result of the IR-Drop analysis stored in the IR-Drop analysis database (step S110) after the IR-Drop analysis is performed (step S40) but before updating of the IR-Drop value list for each instance is performed (step S100). Then, the produced IR-Drop map is stored into the external storage unit 3. It is to be noted that, in FIG. 6, like processes to those in the first embodiment described above are denoted by like step numbers.

Therefore, the timing verification apparatus 10 includes a function (voltage drop map production means) for producing an IR-Drop map (voltage drop map) based on a result of IR-Drop analysis (voltage drop analysis).

More particularly, an updating process (step S100 in FIG. 6) of an IR-Drop value list for each instance is performed as described below.

In particular, where a cell is to be added (for example, a buffer is to be inserted) based on the ECO list, the CPU 1 refers to an IR-Drop map using position information of the additional cell included in the updated arrangement wiring database based on information which indicates addition (for example, insertion of buffers) of a cell included in the ECO list so that a voltage drop range of an IR-Drop value of a block in which the additional cell is to be arranged is read out, and calculates the IR-Drop value based on the read out voltage drop range. For example, an average value (IR-Drop value corresponding to the voltage drop ratio at the center of the range), a maximum value (IR-Drop value corresponding, for example, to the highest voltage drop ratio of the range) or the like is calculated as the IR-Drop value.

For example, where a description which indicates addition of cells (for example, insertion of buffers) is included in the ECO list (for example, refer to the second and third paragraphs in FIG. 4), the CPU 1 reads out the instance names (here, INSERT1, INSERT2 and INSERT3, INSERT4) of the additional cells from the ECO list.

Then, the coordinates X, Y [here, (300000, 700100), (300100, 700100) and (100000, 499900), (100100, 499900)] of the additional cells are read out from the updated arrangement wiring database [refer to FIG. 5(B)] using the instance names of the additional cells.

Then, the IR-Drop map [refer to FIGS. 7(A) and 7(B)] is referred to using the coordinates X, Y so that the blocks [here, block coordinates B(3,7) and B(1,4)] including the coordinates X, Y are specified, and the voltage drop ranges (here, range1 and range2) of the IR-Drop values of the specified blocks are read out.

Thereafter, the IR-Drop values (here, average values 1.09 and 1.07) are calculated based on the read out voltage drop ranges (here, range1 and range2) of the IR-Drop values.

Then, as seen in FIG. 3(B), the IR-Drop values (here, average values 1.09 and 1.07) calculated in such a manner as described above are added as the IR-Drop values of the additional cells to the IR-Drop value list in an associated relationship with the instance names (here, INSERT1, INSERT2 and INSERT3, INSERT4) of the additional cells and the cell name (here, cell name BUFH).

It is to be noted that the IR-Drop map is not limited to that described above, and may be configured, for example, as a map wherein position information of blocks (coordinates of blocks) and IR-Drop values (voltage values after voltage drop) are associated with each other. For example, IR-Drop values (voltage drop information) may be calculated in advance based on a voltage drop range using the calculation method similar to that given hereinabove, and thereafter, the IR-Drop map may be produced wherein the calculated IR-Drop values and position information of blocks (coordinates of blocks) are associated with each other.

It is to be noted that addition of cells and resizing of cells are performed similarly as in the second embodiment described above.

Also it is to be noted that, since the configuration and process other than those described above are similar to those in the second embodiment described above, description of the configuration and process is omitted here.

Accordingly, with the timing verification method, timing verification apparatus and timing verification program according to the embodiment, similarly as with the second embodiment described above, there is an advantage that the processing time can be reduced while the accuracy is maintained.

Particularly, in the embodiment, the IR-Drop map is referred to using the coordinates of additional cells to update the IR-Drop value list for each instance. Therefore, there is an advantage that searching of the arrangement wiring database for specifying the nearest cell using the coordinates of the additional cells and searching of the IR-Drop value list for each instance for calculating the IR-Drop value of the additional cells using the instance name of the nearest cell need not be performed, and the processing time can be reduced still more.

Fourth Embodiment

Now, a timing verification method, a timing verification apparatus and a timing verification program according to a fourth embodiment are described with reference to FIGS. 7(A) and 8.

The timing verification apparatus (timing verification method) according to the embodiment is implemented by applying the timing verification apparatus of the third embodiment described above to that of the first embodiment described above.

In particular, the present timing verification apparatus is different from the timing verification apparatus of the first embodiment described above in that, in order to update the IR-Drop value list for each instance, the IR-Drop map (voltage drop map) produced based on a result of the IR-Drop analysis (voltage drop analysis) is used.

More particularly, in the present timing verification apparatus 10, the IR-Drop value list for each instance and the ECO list stored in the external storage unit 3 are read out and the IR-Drop value list for each instance is updated using the IR-Drop map produced based on a result of the IR-Drop analysis based on the ECO list.

Therefore, the timing verification apparatus 10 is configured such that the voltage drop list updating means updates the IR-Drop value list (voltage drop list) using the IR-Drop map (voltage drop map) based on the ECO list (changing instruction list).

In the embodiment, for example, as seen in FIG. 8, the IR-Drop map shown in FIG. 7(A) includes data wherein instance names, voltage drop ranges (individual ranges; voltage drop information) of IR-Drop values, block coordinates (position information of blocks), left upper and right lower coordinates of blocks (position information of blocks) are associated with each other.

Here, the block indicated by the reference character A in FIG. 7(A) includes such data that the instance name is TOP/inst1/A, the voltage drop range of the IR-Drop value is range1, the block coordinates are B(2,1), and the left upper and right lower coordinates of the block are (1,0), (2,1). Further, the block indicated by the reference character B in FIG. 7(A) includes such data that the instance name is HLB/inst10, the voltage drop range of the IR-Drop value is range2, the block coordinates are B(2,2), and the left upper and right lower coordinates of the block are (1,1), (2,2). Furthermore, the block indicated by the reference character C in FIG. 7(A) includes such data that the instance name is inst3, the voltage drop range of the IR-Drop value is range3, the block coordinates are B(5,3), and the left upper and right lower coordinates of the block are (4,2), (5,3). Further, the block indicated by the reference character D in FIG. 7(A) includes such data that the instance name is ADD/inst5, the voltage drop range of the IR-Drop value is range4, the block coordinates are B(6,5), and the left upper and right lower coordinates of the block are (5,4), (6,5). Further, the block indicated by the reference character E in FIG. 7(A) includes such data that the instance name is BUFCAP, the voltage drop range of the IR-Drop value is range1, the block coordinates are B(3,7), and the left upper and right lower coordinates of the block are (2,6), (3,7). Furthermore, the block indicated by the reference character F in FIG. 7(A) includes such data that the instance name is ChipTop/data, the voltage drop range of the IR-Drop value is range2, the block coordinates are B(1,4), and the left upper and right lower coordinates of the block are (0,3), (1,4).

The IR-Drop map configured in such a manner as described above is produced as a map which includes the instance names by adding the instance names to the IR-Drop map produced as in the third embodiment described above. In particular, the CPU 1 produces the IR-Drop map based on the arrangement wiring data stored in the updated arrangement wiring database and a result of the IR-Drop analysis stored in the IR-Drop analysis database.

Therefore, the timing verification apparatus 10 includes a function (voltage drop map production means) for producing an IR-Drop map (voltage drop map) based on a result of IR-Drop analysis (voltage drop analysis).

In particular, the CPU 1 associates the instance names included in the arrangement wiring data and the voltage drop ranges included in the IR-Drop map with each other using the coordinates (position information) included in the arrangement wiring data and the block coordinates or the left upper and right lower coordinates of the blocks (position information of the blocks) included in the IR-Drop map produced as in the third embodiment described above to produce the IR-Drop map including the instance names.

More particularly, the updating process (step S100 in FIG. 1) of the IR-Drop value list for each instance is performed in such a manner as described below.

First, where a cell is to be added (for example, a buffer is to be inserted) based on the ECO list, the CPU 1 reads out the voltage drop range of the IR-Drop value of the block in which the driver cell or the receiver cell is arranged from the IR-Drop map based on information which indicates addition of a cell (for example, insertion of a buffer) included in the ECO list, and calculates the IR-Drop value based on the read out voltage drop range. For example, an average value (IR-Drop value corresponding to the voltage drop ratio at the center of the range), a maximum value (for example, IR-Drop value corresponding to the highest voltage drop ratio of the range) or the like is calculated as the IR-Drop value.

For example, where a description which indicates insertion of an additional cell (for example, a buffer) into the FANIN side is included in the ECO list (for example, refer to the second paragraph in FIG. 4), the CPU 1 reads out the instance name (here, BUFCAP) of the driver cell from the ECO list and reads out the voltage drop range (here, range1) of the IR-Drop value of the block in which the driver cell is arranged from the IR-Drop map [refer to FIGS. 7(A) and 8] using the instance name of the driver cell.

Then, the IR-Drop value (here, average value 1.09) is calculated based on the read out voltage drop range (here, range1) of the IR-Drop value.

Then, as seen in FIG. 3(B), the IR-Drop value (here, 1.09) calculated in such a manner as described above is added as the IR-Drop value of the additional cell to the IR-Drop value list in an associated relationship with the instance names (here, INSERT1, INSERT2) and the cell name (here, cell name BUFH) of the additional cell.

Further, for example, where a description which indicates insertion of additional cells (for example, buffers) into the FUNOUT side is included in the ECO list (for example, refer to the third paragraph in FIG. 4), the CPU 1 reads out the instance name (here, ChipTop/data) of the receiver cell from the ECO list and reads out the voltage drop range (here, range2) of the IR-Drop value of the block in which the receiver cell is arranged from the IR-Drop map [refer to FIGS. 7(A) and 8] using the instance name of the receiver cell.

Then, the IR-Drop value (here, the average value 1.07) is calculated based on the read out voltage drop range (here, range2) of the IR-Drop value.

Then, as shown in FIG. 3(B), the IR-Drop value (here, 1.07) calculated in such a manner as described above is added as the IR-Drop value of the additional cell to the IR-Drop value list in an associated relationship with the instance names (here, INSERT3, INSERT4) of the additional cells and the cell name (here, cell name BUFH).

It is to be noted that the IR-Drop map is not limited to that described above, and may be configured, for example, as a map wherein position information of blocks (coordinates of blocks) and IR-Drop values (voltage values after voltage drop) are associated with each other. For example, IR-Drop values (voltage drop information) may be calculated in advance based on a voltage drop range using the calculation method similar to that described above, and thereafter, the IR-Drop map may be produced wherein the calculated IR-Drop values and position information of blocks (coordinates of blocks) are associated with each other.

It is to be noted that addition of cells and resizing of cells are performed similarly as in the first embodiment described above.

Also it is to be noted that, since the configuration and process other than those described above are similar to those of the first embodiment described above, description of the configuration and process is omitted here.

Accordingly, with the timing verification method, timing verification apparatus and timing verification program according to the embodiment, similarly as with the first embodiment described above, there is an advantage that the processing time can be reduced while the accuracy is maintained.

Particularly, in the embodiment, the IR-Drop map is referred to using the instance name of an additional cell to update the IR-Drop value list for each instance. Therefore, there is an advantage that searching of the IR-Drop value list for each instance using the instance name of the driver cell or the receiver cell for calculating the IR-Drop value of the additional cell similarly as in the first embodiment described above need not be performed, and the processing time can be reduced still more.

[Others]

It is to be noted that, while timing analysis by a static timing analyzer is performed in the embodiments described above, the embodiment is not limited to this. For example, crosstalk analysis may be performed as timing analysis.

Further, in the embodiments described above, while the IR-Drop analysis is performed in the first-time timing verification process to produce the IR-Drop value list and then the IR-Drop value list is updated based on the ECO list without performing the IR-Drop analysis in the later timing verification processes, the embodiment is limited to this, and the IR-Drop analysis may be suitably performed to re-produce the IR-Drop value list in the second and later timing verification processes. In particular, in all of the second and later timing verification processes, the IR-Drop value list need not be updated based on the ECO list without performing the IR-Drop analysis, but the IR-Drop value list may be updated based on the ECO list without performing the IR-Drop analysis in part of the second and later timing verification processes.

For example, where many target portions of the ECO process remain also in the second and later timing verification processes, that is, where many portions for which addition, deletion and resizing of cells are to be performed remain, the IR-Drop analysis may be performed. In particular, where it is decided whether or not the number of ECO processing target portions (changing instructions in the ECO list) is a predetermined number or more and a result of the decision is obtained that the number of the ECO processing target portions is the predetermined number or more, the IR-Drop analysis may be performed to re-produce the IR-Drop value list, but, where the number of the ECO processing target portions is less than the predetermined number, the IR-Drop value list may be updated based on the ECO list without performing the IR-Drop analysis.

Further, while, in the embodiments described above, the timing verification apparatus is configured as an apparatus wherein the timing verification program is installed into a computer, the timing verification program for causing a computer to execute the process in each embodiment (timing verification program for causing a computer to implement such functions as described above) may possibly be provided in a state wherein the timing verification program is stored on a computer-readable recording medium.

Here, as the recording medium, a medium which can record the program such as, for example, a memory such as a semiconductor memory, a magnetic disk, an optical disk (for example, a CD-ROM, a DVD and so forth), a magneto-optical disk (MO), a storage unit of a server and so forth is used. It is to be noted that each of a magnetic disk, an optical disk, a magneto-optical disk and so forth is sometimes called portable type recording medium.

In this instance, the timing verification program is read out from the portable type recording medium through a drive unit and the read out timing verification program is installed into an external storage unit. Consequently, the timing verification apparatus and timing verification method described in the embodiments described above are implemented, and, similarly as in the embodiments described above, a CPU performs the timing verification process by reading out the timing verification program installed in the external storage unit into a memory and executing the read out program.

Further, the timing verification program for causing a computer to execute the process in the embodiments described above is sometimes provided, for example, through a network (for example, the Internet, a communication line such as a public line, a private line or the like) as a transmission medium.

In this instance, the timing verification program uploaded, for example, on a web server through a communication unit is downloaded, for example, through a network such as the Internet and is installed into an external storage unit. Consequently, the timing verification apparatus and timing verification method described hereinabove in connection with the embodiments are implemented, and, similarly as in the embodiments described above, a CPU performs the timing verification process by reading out the timing verification program installed in the external storage unit into a memory and executing the read out program.

In the conventional timing ECO process repetitively performed until a timing error is eliminated, the IR-Drop analysis is performed for the entire circuit for every process to be repetitively performed as described above, there is a subject that much processing time is required.

Particularly, where the number of ECO processing object portions is small, that is, where the number of portions for which addition, deletion and resizing of a cell are to be performed is small, most of time required for the IR-Drop analysis is spent on the IR-Drop analysis of those portions for which the IR-Drop analysis is performed already.

Further, where an IR-Drop value list for each instance is produced based on a result of IR-Drop analysis stored in an IR-Drop analysis database in order to perform timing analysis, since an IR-Drop value list is produced for every process to be repetitively performed, processing time further increases.

The aforementioned embodiments provides a timing verification method, a timing verification apparatus and a timing verification program which can achieve reduction of processing time while the accuracy is maintained.

The present invention is not limited to the embodiments specifically described above, and variations and modifications can be made without departing from the scope of the embodiments.

What is claimed is:

1. A timing verification method, comprising:
performing, using a computer, timing analysis taking a voltage drop of a laid out circuit into consideration; and
producing, using a computer, a changing instruction list for changing the laid out circuit based on a result of the timing analysis; wherein,
in a first-time timing verification process performed by a computer, voltage drop analysis is performed for the laid out circuit and a voltage drop list is produced based on a result of the voltage drop analysis, and then the timing analysis is performed using the voltage drop list; and
in all or part of a second-time and later timing verification process performed by a computer, the voltage drop list is updated based on the changing instruction list without performing the voltage drop analysis and the timing analysis is performed using the updated voltage drop list.

2. The timing verification method as claimed in claim 1, further comprising:
producing, using a computer, an arrangement wiring database based on a result of a layout process;
updating, using a computer, the arrangement wiring database based on the result of the layout process based on the changing instruction list; and
updating, using a computer, the voltage drop list using the updated arrangement wiring database based on the changing instruction list.

3. The timing verification method as claimed in claim 1, further comprising:
producing, using a computer, an arrangement wiring database based on a result of a layout process;
updating, using a computer, the arrangement wiring database based on the a result of a layout process based on the changing instruction list;
producing, using a computer, a voltage drop map wherein position information of blocks obtained by dividing a chip such that each of the blocks includes a plurality of cells and voltage drop information are associated with each other based on a result of the voltage drop analysis; and
updating, using a computer, the voltage drop list using the updated arrangement wiring database and the voltage drop map based on the changing instruction list.

4. The timing verification method as claimed in claim 1, further comprising:
producing, using a computer, a voltage drop map wherein position information of blocks obtained by dividing a chip such that each of the blocks includes a plurality of cells and voltage drop information are associated with each other based on a result of the voltage drop analysis; and
updating, using a computer, the voltage drop list using the voltage drop map based on the changing instruction list.

5. The timing verification method as claimed in claim 1, further comprising:
producing, using a computer, a list wherein instance names and voltage values after voltage drop are associated with each other as the voltage drop list;
producing, using a computer, a list wherein instance names and changing instruction information are associated with each other as the changing instruction list; and
updating, using a computer, the voltage drop list using the instance names and changing instruction information included in the changing instruction list.

6. The timing verification method as claimed in claim 2, further comprising:
producing, using a computer, a list wherein instance names and voltage values after voltage drop are associated with each other as the voltage drop list;
producing, using a computer, a list wherein instance names and changing instruction information are associated with each other as the changing instruction list;
producing, using a computer, the arrangement wiring database as a database wherein instance names and position information are associated with each other; and
updating, using a computer, the voltage drop list using the instance names and changing instruction information included in the changing instruction list and the position information included in the arrangement wiring database.

7. The timing verification method as claimed in claim 3, further comprising:
producing, using a computer, a list wherein instance names and voltage values after voltage drop are associated with each other as the voltage drop list;
producing, using a computer, a list wherein instance names and changing instruction information are associated with each other as the changing instruction list;
producing, using a computer, the arrangement wiring database as a database wherein instance names and position information are associated with each other; and
updating, using a computer, the voltage drop list using the instance names and changing instruction information included in the changing instruction list, the position information included in the arrangement wiring database, and the position information of the blocks and voltage drop information included in the voltage drop map.

8. The timing verification method as claimed in claim 4, further comprising:
producing, using a computer, a list wherein instance names and voltage values after voltage drop are associated with each other as the voltage drop list;

producing, using a computer, a list wherein instance names and changing instruction information are associated with each other as the changing instruction list;

producing, using a computer, a map wherein instance names, the position information of the blocks and the voltage drop information are associated with each other as the voltage drop map; and updating, using a computer, the voltage drop list using the instance names and changing instruction information included in the changing instruction list and the instance names and voltage drop information included in the voltage drop map.

9. A timing verification program embodied on a non-transitory computer-readable medium and causing a computer to execute:

performing timing analysis taking a voltage drop of a laid out circuit into consideration; and producing a changing instruction list for changing the laid out circuit based on a result of the timing analysis; wherein in a first timing verification process, voltage drop analysis is performed for the laid out circuit and a voltage drop list is produced based on a result of the voltage drop analysis, and then timing analysis is performed using the voltage drop list; and in all or part of a second-time and later timing verification process, the voltage drop list is updated based on the changing instruction list without performing the voltage drop analysis and timing analysis is performed using the updated voltage drop list.

10. The timing verification program embodied on a non-transitory computer-readable medium as claimed in claim 9, wherein the timing verification program causes the computer to further execute:

producing an arrangement wiring database based on a result of a layout process;

updating the arrangement wiring database based on a result of the layout process based on the changing instruction list; and updating the voltage drop list using the updated arrangement wiring database based on the changing instruction list.

11. The timing verification program embodied on a non-transitory computer-readable medium as claimed in claim 9, wherein the timing verification program causes the computer to further execute:

producing an arrangement wiring database based on a result of a layout process;

updating the arrangement wiring database based on a result of the layout process based on the changing instruction list;

producing a voltage drop map wherein position information of blocks obtained by dividing a chip such that each of the blocks includes a plurality of cells and voltage drop information are associated with each other based on a result of the voltage drop analysis; and updating the voltage drop list using the updated arrangement wiring database and the voltage drop map based on the changing instruction list.

12. The timing verification program embodied on a non-transitory computer-readable medium as claimed in claim 9, wherein the timing verification program causes the computer to further execute:

producing a voltage drop map wherein position information of blocks obtained by dividing a chip such that each of the blocks includes a plurality of cells and voltage drop information are associated with each other based on a result of the voltage drop analysis; and updating the voltage drop list using the voltage drop map based on the changing instruction list.

13. A timing verification apparatus, comprising:

a voltage drop analysis part performing voltage drop analysis for a laid out circuit;

voltage drop list production part producing a voltage drop list based on a result of the voltage drop analysis;

timing analysis part performing timing analysis;

a list producing part producing a changing instruction list for changing the laid out circuit based on a result of the timing analysis; and voltage drop list updating part updating the voltage drop list based on the changing instruction list; wherein said timing analysis part performs, in a first-time process, the voltage drop analysis by said voltage drop analysis part and timing analysis using the voltage drop list produced by said voltage drop list production part and performs, in all or part of a second-time and later process, timing analysis using the voltage drop list updated by said voltage drop list updating part without performing the voltage drop analysis by said voltage drop analysis part.

14. The timing verification apparatus as claimed in claim 13, further comprising:

a database producing part producing an arrangement wiring database based on a result of a layout process; and a database updating part updating the arrangement wiring database based on a result of a layout process based on the changing instruction list; and wherein said voltage drop list updating part updates the voltage drop list using the updated arrangement wiring database based on the changing instruction list.

15. The timing verification apparatus as claimed in claim 13, further comprising:

a database producing part producing an arrangement wiring database based on a result of a layout process;

a database updating part updating the arrangement wiring database based on a result of a layout process based on the changing instruction list; and a map producing part producing a voltage drop map wherein position information of blocks obtained by dividing a chip such that each of the blocks includes a plurality of cells and voltage drop information are associated with each other based on a result of the voltage drop analysis; and wherein said voltage drop list updating part updates the voltage drop list using the updated arrangement wiring database and the voltage drop map based on the changing instruction list.

16. The timing verification apparatus as claimed in claim 13, further comprising:

a map producing part producing a voltage drop map wherein position information of blocks obtained by dividing a chip such that each of the blocks includes a plurality of cells and voltage drop information are associated with each other based on a result of the voltage drop analysis; and wherein said voltage drop list updating part updates the voltage drop list using the voltage drop map based on the changing instruction list.

* * * * *

UNITED STATES PATENT AND TRADEMARK OFFICE
CERTIFICATE OF CORRECTION

PATENT NO. : 8,166,432 B2  
APPLICATION NO. : 11/907395  
DATED : April 24, 2012  
INVENTOR(S) : Kazuyuki Kosugi Page 1 of 1

It is certified that error appears in the above-identified patent and that said Letters Patent is hereby corrected as shown below:

Column 17, Line 64, In Claim 3, delete "the a" and insert -- the --, therefor.

Signed and Sealed this
Third Day of July, 2012

David J. Kappos
*Director of the United States Patent and Trademark Office*